United States Patent
Niu et al.

(10) Patent No.: US 11,171,159 B2
(45) Date of Patent: Nov. 9, 2021

(54) DISPLAY BACKPLANE AND METHOD FOR MANUFACTURING THE SAME, DISPLAY PANEL AND DISPLAY DEVICE

(71) Applicant: BOE TECHNOLOGY GROUP CO., LTD., Beijing (CN)

(72) Inventors: Yanan Niu, Beijing (CN); Jiushi Wang, Beijing (CN); Lei Chen, Beijing (CN); Hongwei Tian, Beijing (CN); Zhanfeng Cao, Beijing (CN); Feng Guan, Beijing (CN); Feng Zhang, Beijing (CN); Shi Shu, Beijing (CN); Kuanjun Peng, Beijing (CN); Yichi Zhang, Beijing (CN); Qi Qi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/630,657

(22) PCT Filed: Jan. 3, 2019

(86) PCT No.: PCT/CN2019/070236
§ 371 (c)(1),
(2) Date: Jan. 13, 2020

(87) PCT Pub. No.: WO2020/140228
PCT Pub. Date: Jul. 9, 2020

(65) Prior Publication Data
US 2020/0286926 A1    Sep. 10, 2020

(51) Int. Cl.
*H01L 21/00* (2006.01)
*H01L 27/00* (2006.01)
(Continued)

(52) U.S. Cl.
CPC .... *H01L 27/1225* (2013.01); *H01L 21/02565* (2013.01); *H01L 21/02568* (2013.01);
(Continued)

(58) Field of Classification Search
CPC ......... H01L 21/02565; H01L 21/02568; H01L 21/477; H01L 21/823807; H01L 27/1225;
(Continued)

(56) References Cited

U.S. PATENT DOCUMENTS 9,728,592 B2 *  8/2017  Huang ............... H01L 27/3248
10,199,506 B2 *  2/2019  Lu .................... H01L 29/78675
(Continued)

FOREIGN PATENT DOCUMENTS

CN    101847648 A    9/2010
CN    103077957 A    5/2013
(Continued)

*Primary Examiner* — Nikolay K Yushin
(74) *Attorney, Agent, or Firm* — The Webb Law Firm (57) ABSTRACT

The present disclosure provides a display backplane and a method for manufacturing the same, a display panel, and a display device. The display backplane includes: a substrate; a first thin film transistor located on one side of the substrate; and a second thin film transistor located on the one side of the substrate, wherein: the first thin film transistor comprises a first active layer, the second thin film transistor comprises a second active layer, wherein the first active layer and the second active layer are located in a same layer, and a material of the first active layer is different from that of the second active layer.

20 Claims, 5 Drawing Sheets

(51) Int. Cl.
 *H01L 29/00* (2006.01)
 *H01L 27/12* (2006.01)
 *H01L 21/02* (2006.01)
 *H01L 29/66* (2006.01)
 *H01L 29/786* (2006.01)
 *H01L 27/32* (2006.01)
(52) U.S. Cl.
 CPC ...... *H01L 27/1237* (2013.01); *H01L 27/1259* (2013.01); *H01L 29/66969* (2013.01); *H01L 29/7869* (2013.01); *H01L 27/3262* (2013.01); *H01L 2227/323* (2013.01)
(58) Field of Classification Search
 CPC ............. H01L 27/1237; H01L 27/1259; H01L 27/3262; H01L 29/66969; H01L 29/78681; H01L 29/7869; H01L 2227/323
 See application file for complete search history.

(56) References Cited

U.S. PATENT DOCUMENTS

| | | | |
|---|---|---|---|
| 10,361,229 B2 * | 7/2019 | Yamaguchi | ........... H01L 27/127 |
| 2010/0238095 A1 | 9/2010 | Zhang | |
| 2014/0246653 A1 | 9/2014 | Wu | |
| 2016/0126293 A1 | 5/2016 | Li et al. | |
| 2016/0300957 A1 * | 10/2016 | Lu | ..................... H01L 29/78675 |
| 2017/0040394 A1 * | 2/2017 | Huang | ................ H01L 27/3248 |
| 2018/0294286 A1 * | 10/2018 | Yamaguchi | ....... H01L 29/78693 |
| 2019/0165004 A1 | 5/2019 | Lou et al. | |

FOREIGN PATENT DOCUMENTS

| | | |
|---|---|---|
| CN | 107818989 A | 3/2018 |
| CN | 107978610 A | 5/2018 |
| CN | 109003991 A | 12/2018 |

\* cited by examiner

DISPLAY BACKPLANE AND METHOD FOR MANUFACTURING THE SAME, DISPLAY PANEL AND DISPLAY DEVICE

CROSS-REFERENCE TO RELATED APPLICATIONS

The present application is a U.S. National Stage Application under 35 U.S.C. § 371 of International Patent Application No. PCT/CN2019/070236, filed on Jan. 3, 2019, the disclosure of which is incorporated by reference herein in its entirety.

TECHNICAL FIELD

The present disclosure relates to the field of display technology, and in particularly, to a display backplane and a method for manufacturing the same, a display panel, and a display device.

BACKGROUND

With excellent properties such as low power consumption, high degree of color saturation, wide viewing angle, small thickness and flexibility, OLED (Organic Light-Emitting Diode) display panels are gradually applied to terminal products such as smart mobile phones, tablets, and televisions.

In the related art, a LTPO (low temperature polycrystalline oxide) process is used to form a backplane of the OLED display panel.

SUMMARY

According to one aspect of embodiments of the present disclosure, a display backplane is provided. The display backplane comprises: a substrate; a first thin film transistor located on one side of the substrate; and a second thin film transistor located on the one side of the substrate, wherein: the first thin film transistor comprises a first active layer, the second thin film transistor comprises a second active layer, wherein the first active layer and the second active layer are located in a same layer, and a material of the first active layer is different from that of the second active layer.

In some embodiments, the first thin film transistor comprises a first gate dielectric layer located on one side of the first active layer away from the substrate, and the second thin film transistor comprises a second gate dielectric layer located on one side of the second active layer away from the substrate, wherein the first gate dielectric layer is denser than the second gate dielectric layer.

In some embodiments, the first thin film transistor further comprises: a third gate dielectric layer located on one side of the first gate dielectric layer away from the first active layer; wherein the third gate dielectric layer and the second gate dielectric layer are formed by a same patterning process.

In some embodiments, the orthographic projection of the first gate dielectric layer on the substrate is a first projection, and the orthographic projection of the third gate dielectric layer on the substrate is a second projection, wherein the first projection covers the second projection, and an area of the first projection is greater than that of the second projection.

In some embodiments, a thickness of the first active layer is smaller than that of the second active layer.

In some embodiments, the first thin film transistor further comprises an ohmic contact layer in contact with the first active layer, wherein the ohmic contact layer comprises a first portion and a second portion spaced apart from each other; the display backplane comprises an interlayer dielectric layer, wherein the interlayer dielectric layer defines a first opening exposing a first area of the first portion and a second opening exposing a second area of the second portion; the first thin film transistor further comprises a first source located in the first opening and in contact with the first area, and a first drain located in the second opening and in contact with the second area.

In some embodiments, the interlayer dielectric layer further defines a third opening exposing a third area of the second active layer and a fourth opening exposing a fourth area of the second active layer; the second thin film transistor further comprises a second source located in the third opening and in contact with the third area, and a second drain located in the fourth opening and in contact with the fourth area; wherein the first source, the first drain, the second source, and the second drain are formed by a same patterning process.

In some embodiments, the first thin film transistor comprises a first gate located on one side of the first gate dielectric layer away from the first active layer; the second thin film transistor comprises a second gate located on one side of the second gate dielectric layer away from the second active layer, wherein the second gate and the first gate are formed by a same patterning process.

In some embodiments, a material of the first active layer comprises molybdenum disulfide or oxide semiconductor, and a material of the second active layer comprises oxide semiconductor.

In some embodiments, the first thin film transistor is a thin film transistor of a driving circuit or a switching transistor in a pixel; the second thin film transistor is a driving transistor configured to drive a light emitting device in the pixel to emit light.

According to another aspect of embodiments of the present disclosure, a display panel is provided. The display device comprises: the display backplane according to any one of the above embodiments.

According to still another aspect of embodiments of the present disclosure, a display device is provided. The display device comprises: the display panel according to any one of the above embodiments.

According to yet still another aspect of embodiments of the present disclosure, a method for manufacturing a display backplane is provided. The method comprises: providing a substrate; forming, on one side of the substrate, a first thin film transistor and a second thin film transistor, wherein the first thin film transistor comprises a first active layer, and the second thin film transistor comprises a second active layer, wherein: the first active layer and the second active layer are located in a same layer, and a material of the first active layer is different from that of the second active layer.

In some embodiments, a thickness of the first active layer is smaller than that of the second active layer.

In some embodiments, forming, on the one side of the substrate, the first thin film transistor and the second thin film transistor located comprises: forming, on the one side of the substrate, the first active layer, a first gate dielectric layer, the second active layer, and a second gate dielectric layer, wherein the first gate dielectric layer is located on one side of the first active layer away from the substrate, the second gate dielectric layer is located on one side of the second active layer away from the substrate, and the first gate dielectric layer is denser than the second gate dielectric layer.

In some embodiments, forming, on the one side of the substrate, the first active layer, the first gate dielectric layer, the second active layer, and the second gate dielectric layer comprises: forming the first active layer on the one side of the substrate; forming the first gate dielectric layer on the one side of the first active layer away from the substrate; forming the second active layer after forming the first gate dielectric layer; and forming a third gate dielectric layer on one side of the first gate dielectric layer away from the first active layer and the second gate dielectric layer by a first patterning process.

In some embodiments, forming, on the one side of the substrate, the first thin film transistor and the second thin film transistor located further comprises: forming a first gate on one side of the first gate dielectric layer away from the first active layer and a second gate on one side of the second gate dielectric layer away from the second active layer by a second patterning process; and forming a first source and a first drain each electrically connected to the first active layer, and a second source and a second drain each electrically connected to the second active layer by a third patterning process.

In some embodiments, the method further comprises: forming, before forming the second active layer, an ohmic contact layer in contact with the first active layer, wherein the ohmic contact layer comprises a first portion and a second portion spaced apart from each other; forming, before the third patterning process, an interlayer dielectric layer, where the interlayer dielectric layer defines a first opening exposing a first area of the first portion, a second opening exposing a second area of the second portion, a third opening exposing a third area of the second active layer, and a fourth opening exposing a fourth area of the second active layer; wherein the first source is located in the first opening and in contact with the first area, the first drain is located in the second opening and in contact with the second area, the second source is located in the third opening and in contact with the third area, and the second drain is located in the fourth opening and in contact with the fourth area.

In some embodiments, a material of the first active layer comprises molybdenum disulfide or oxide semiconductor, and a material of the second active layer comprises oxide semiconductor.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be more clearly understood from the following detailed description with reference to the accompanying drawings, in which.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that, during the process of forming a backplane by LTPO process, amorphous silicon needs to be processed into polysilicon by an excimer laser annealing process. Before the excimer laser annealing process, a high-temperature dehydrogenation process is required. After the excimer laser annealing process, a high-temperature hydrogenation process is also required. In order to prevent the high-temperature dehydrogenation process and the high-temperature hydrogenation process from affecting a thin film transistor with an active layer of oxide semiconductor, it is necessary to first form a thin film transistor with an active layer of LTPS (low temperature polycrystalline silicon), and then form a thin film transistor with an active layer of oxide semiconductor.

Therefore, a plurality of film layers, such as a gate dielectric layer, a gate layer, an interlayer dielectric layer, a buffer layer, and the like, are stacked between the LTPS layer and the oxide semiconductor layer. The stacked film layers may cause stress accumulation, which is likely to result in cracks between different layers in the backplane. Especially in a flexible display scenario, since the backplane needs to be bent, cracks are more likely to occur between different layers in the backplane, which may affect the normal performance of the backplane, thereby affecting the display effect of the display panel.

Based on the above considerations, the embodiments of the present disclosure provide the following technical solutions.

Figure 1:
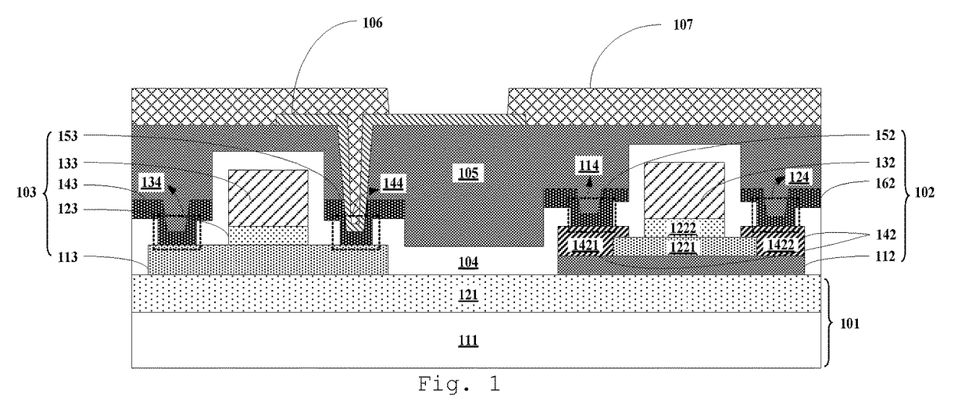
FIG. 1 is a schematic structural view showing a display backplane according to an embodiment of the present disclosure.

FIG. 1 is a schematic structural view showing a display backplane according to an embodiment of the present disclosure.

As shown in FIG. 1, the display backplane comprises a substrate 101, and a first thin film transistor 102 and a second thin film transistor 103 that are located on one side of the substrate 101.

The substrate 101 may comprise, for example, a substrate layer 111 and a buffer layer 121 located on one side of the substrate layer 111. The substrate layer 111 may comprise, for example, a single-layer flexible substrate layer or a double-layer flexible substrate layer. The material of the substrate layer may comprise, for example, polyimide. The buffer layer 121 may comprise, for example, a nitride layer of silicon, an oxide layer of silicon, or a lamination comprising a nitride layer of silicon and an oxide layer of silicon.

The first thin film transistor 102 comprises a first active layer 112. The second thin film transistor 103 comprises a second active layer 113. The first active layer 112 and the second active layer 113 are located in a same layer, and the material of the first active layer 112 is different from that of the second active layer 113.

Here, the definition that "the first active layer 112 and the second active layer 113 are located in a same layer" may be understood that the first active layer 112 and the second active layer 113 are both located on the surface of the substrate 101.

In the above embodiments, the first active layer of the first thin film transistor and the second active layer of the second thin film transistor are located in the same layer. Such a display backplane has a smaller number of film layers and a smaller thickness. The possibility of occurrence of cracks between different layers in the display backplane is reduced, thereby reducing the adverse effects caused by the cracks on the display backplane and improving the yield of the display backplane.

The first thin film transistor 102 and the second thin film transistor 103 may be used for different functions.

In some embodiments, the first thin film transistor 102 is a thin film transistor of a driving circuit, and the second thin film transistor 103 is a driving transistor configured to drive a light emitting device (such as an OLED device) in a pixel to emit light. For example, the first thin film transistor 102 may be one of a plurality of thin film transistors of a gate driving circuit or a source driving circuit. The drain of the second thin film transistor 103 may be connected to a power voltage terminal, the source of the second thin film transistor 103 may be connected to the anode of the OLED device, and the gate of the second thin film transistor 103 may be connected to one end of the storage capacitor in the pixel and the drain of the switching transistor.

In other embodiments, the first thin film transistor 102 is a switching transistor in a pixel, and the second thin film transistor 103 is a driving transistor configured to drive a light emitting device in the pixel to emit light. For example, the gate of the first thin film transistor 102 may be configured to receive a scan signal, the source of the first thin film transistor 102 may be configured to receive a data signal, and the drain of the first thin film transistor 102 is connected to the gate of the second thin film transistor and one end of the storage capacity in the pixel. The drain of the second thin film transistor 103 may be connected to the power supply voltage terminal, the source of the second thin film transistor 103 may be connected to the anode of the light emitting device, and the gate of the second thin film transistor 103 may be connected to the drain of the first thin film transistor 102 and one end of the storage capacitor.

In some embodiments, the material of the first active layer 112 may comprise molybdenum disulfide, and the material of the second active layer 113 may comprise an oxide semiconductor such as indium gallium zinc oxide (IGZO), indium tin zinc oxide (ITZO) and the like. The process of forming the molybdenum disulfide is similar to the process of forming the oxide semiconductor as high temperature is not required in both processes, so the molybdenum disulfide and the oxide semiconductor may be formed in the same layer. In other embodiments, the material of the first active layer 112 and the material of the second active layer 113 may each comprise an oxide semiconductor. For example, the material of the first active layer 112 comprises a first oxide semiconductor, and the material of the second active layer 113 comprises a second oxide semiconductor. The mobility of the first oxide semiconductor is greater than that of the second oxide semiconductor.

In some embodiments, the thickness of the first active layer 112 may be smaller than the thickness of the second active layer 113. For example, the thickness of the first active layer 112 is less than 100 Angstroms, and the thickness of the second active layer 113 ranges from 200 Angstroms to 800 Angstroms, for example, 300 Angstroms, 500 Angstroms, or the like.

In some embodiments, referring to FIG. 1, the first thin film transistor 102 comprises a first gate dielectric layer 1221 located on one side of the first active layer 112 away from the substrate, the second thin film transistor 103 comprises a second gate dielectric layer 123 located on one side of the second active layer 113 away from the substrate 101, and the first gate dielectric layer 1221 is denser than the second gate dielectric layer 123 to protect the first active layer 112. For example, in the case where the first active layer 112 is thin, the dense first gate dielectric layer 1221 may protect the first active layer 112 from damage in subsequent processes.

In some embodiments, referring to FIG. 1, the first thin film transistor 102 further comprises a third gate dielectric layer 1222. The third gate dielectric layer 1222 is located on one side of the first gate dielectric layer 1221 away from the first active layer 112. Here, the first gate dielectric layer 1221 is denser than the third gate dielectric layer 1222, and the material of the third gate dielectric layer 1222 is the same as that of the second gate dielectric layer 123. In some implementations, the material of the first gate dielectric layer 1221 may comprise aluminum oxide or hafnium dioxide formed by an atomic layer deposition (ALD) process, and the material of the third gate dielectric layer 1222 may comprise an oxide of silicon, such as silicon dioxide. As some examples, the thickness of the first gate dielectric layer 1221 is smaller than that of the third gate dielectric layer 1222. For example, the thickness of the first gate dielectric layer 1221 is less than 100 angstroms, and the thickness of the third gate dielectric layer 1222 ranges from 200 angstroms to 800 angstroms, for example, 300 angstroms, 500 angstroms, or the like.

In some embodiments, the second gate dielectric layer 123 and the third gate dielectric layer 1222 are formed by a same patterning process. It should be noted that, the definition "formed by a same patterning process" mentioned here and later means formed by patterning a same material layer with a single patterning process.

In some embodiments, referring to FIG. 1, the first thin film transistor 102 comprises a first gate 132 located on one side of the first gate dielectric layer 1221 away from the first active layer 112, and the second thin film crystal 103 comprises a second gate 133 located on one side of the second gate dielectric layer 123 away from the second active layer 113. In some embodiments, the second gate 133 and the first gate 123 are formed by a same patterning process. It should be understood that, in the case where the first thin film transistor 102 comprises the third gate dielectric layer 1222, the first gate 132 is located on one side of the third gate dielectric layer 1222 away from the first gate dielectric layer 1221.

In some embodiments, referring to FIG. 1, the first thin film transistor 102 further comprises an ohmic contact layer 142 in contact with the first active layer 112. The ohmic contact layer 142 comprises a first portion 1421 and a second portion 1422 spaced apart from each other. In these embodiments, the display backplane comprises an interlayer dielectric layer 104 defining a first opening 114 that exposes a first area of the first portion 1421 and a second opening 124 that exposes a second area of the second portion 1422. The first thin film transistor 102 further comprises a first source 152 located in the first opening 114 and in contact with the first area, and a first drain 162 located in the second opening 124 and in contact with the second area.

The material of the ohmic contact layer 142 may comprise, for example, one or more of the following: titanium, gold, aluminum, and copper. In some embodiments, the material of the ohmic contact layer 142 may be titanium to be better compatible with the manufacturing process of the display backplane.

In the case where the first active layer 112 is thin, when the interlayer dielectric layer 104 is etched to form the first opening 114 and the second opening 124, the first active layer 112 might be etched at the same time. This makes the first source 152 and the first drain 162 that are subsequently formed in poor contact, and may even not contact, with the first active layer 112. Thus, the first source 152 and the first drain 162 cannot be electrically connected to the first active layer 112 effectively.

In the above embodiments, the first thin film transistor comprises an ohmic contact layer. When the interlayer dielectric layer is etched to form the first opening and the second opening, with the protection of the ohmic contact layer, the first active layer will not be etched. Therefore, such a structure may ensure that the first source and the first drain can be electrically connected to the first active layer through the ohmic contact layer, thereby improving the reliability of the display backplane.

In some embodiments, referring to FIG. 1, the interlayer dielectric layer 104 further defines a third opening 134 that exposes a third area of the second active layer 113 and a fourth opening 144 that exposes a fourth area of the second active layer 113. The second thin film transistor 103 further comprises a second source 143 located in the third opening 134 and in contact with the third area, and a second drain 153 located in the fourth opening 144 and in contact with the fourth area. In some embodiments, the first source 152, the first drain 162, the second source 143, and the second drain 153 are formed by a same patterning process.

In the above embodiments, the respective gates of the first thin film transistor and the second thin film transistor may be formed by a same patterning process, and the respective sources and drains may be formed by a same patterning process. Moreover, the first thin film transistor and the second thin film transistor may share an interlayer dielectric layer. Compared with forming a first thin film transistor before forming a second thin film transistor, such a display backplane has a smaller thickness.

In some embodiments, referring to FIG. 1, the display backplane may further comprise a planarization layer 105 covering the first thin film transistor 102 and the second thin film transistor 103, an anode layer 106, and a pixel definition layer 107. The anode layer 106 may be electrically connected to the second drain 153. The pixel definition layer 107 defines an opening that exposes at least a part of the anode layer 106.

Figure 2:
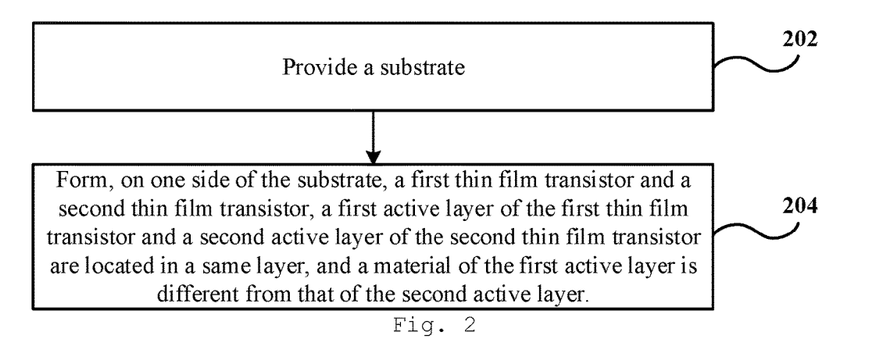
FIG. 2 is a schematic flow chart showing a method for manufacturing a display backplane according to an embodiment of the present disclosure.

FIG. 2 is a schematic flow chart showing a method for manufacturing a display backplane according to an embodiment of the present disclosure. FIGS. 3A-3I are schematic cross-sectional views showing structures obtained at different stages of a method for manufacturing a backplane according to some embodiments of the present disclosure.

The method for manufacturing the display backplane is described in detail below in conjunction with FIGS. 2, and 3A-3I.

First, at step 202, a substrate is provided.

Figure 3A:
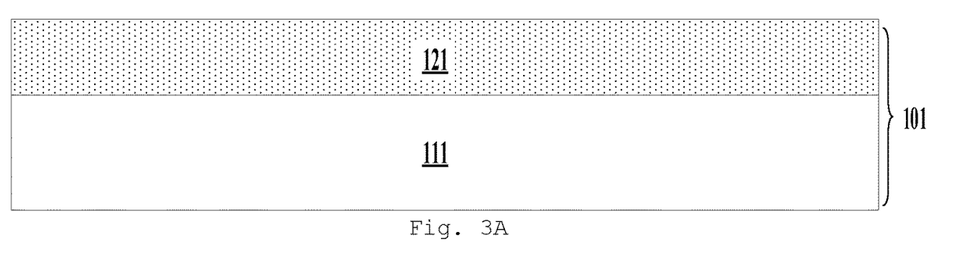
FIGS. 3A-3I are schematic cross-sectional views showing structures obtained at different stages of a method for manufacturing a backplane according to some embodiments of the present disclosure.

As shown in FIG. 3A, the substrate 101 may comprise a substrate layer 111 and a buffer layer 121 on one side of the substrate layer 111.

For example, the substrate layer 111 may be formed by a coating process within a temperature range of 450° C. to 550° C. The thickness of the substrate layer 111 may range from 5 μm to 20 μm, for example, 10 μm, 15 μm, or the like. For example, the buffer layer 121 may be formed by a chemical vapor deposition at a temperature less than 500° C. The thickness of the buffer layer 121 may be, for example, 1000 angstroms to 7000 angstroms, for example, 3000 angstroms, 5,000 angstroms, or the like.

At step 204, a first thin film transistor 102 and a second thin film transistor 103 are formed on one side of the substrate 101. The first thin film transistor 102 comprises a first active layer 112, the second thin film transistor 103 comprises a second active layer 113, the first active layer 112 and the second active layer 113 are located in a same layer, and the material of the first active layer 112 is different from that of the second active layer 113. In some embodiments, the thickness of the first active layer 112 is smaller than that of the second active layer 113.

In some embodiments, the step of forming the first thin film transistor 102 and the second thin film transistor 103 may comprise: forming a first active layer 112, a first gate dielectric layer 1221, a second active layer 113, and a second gate dielectric layer 123 on one side of the substrate 101.

Here, the first gate dielectric layer 1221 is located on one side of the first active layer 112 away from the substrate 101, the second gate dielectric layer 123 is located on one side of the second active layer 113 away from the substrate 101, and the first gate dielectric layer 1221 is denser than the second gate dielectric layer 123.

The first active layer 112, the first gate dielectric layer 1221, the second active layer 113, and the second gate dielectric layer 123 may be formed in a plurality of different sequences. For example, the first active layer 112, the first gate dielectric layer 1221, the second active layer 113, and the second gate dielectric layer 123 may be sequentially formed. For another example, the second active layer 113 may be formed before the first gate dielectric layer 1221 is formed.

The process of forming the first thin film transistor 102 and the second thin film transistor 103 according to some embodiments of the present disclosure will be introduced below in conjunction with FIGS. 3B-3G.

Figure 3B:
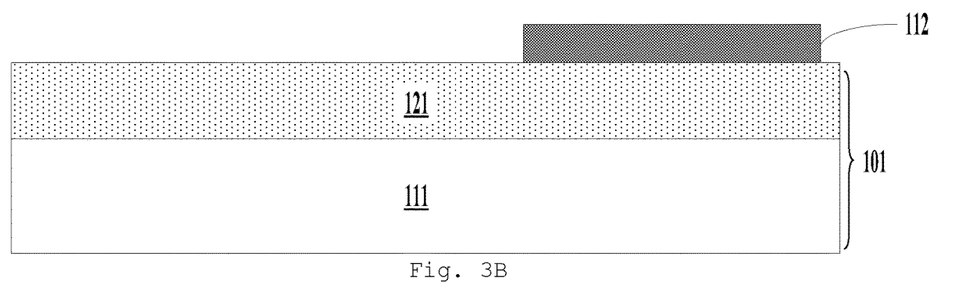

As shown in FIG. 3B, the first active layer 112 is formed on one side of the substrate 101.

For example, the first active layer 112 may be formed by a magnetron sputtering process or a chemical vapor deposition process at a temperature less than 450° C. The material of the first active layer 112 may be, for example, molybdenum disulfide. The thickness of the first active layer 112 may be, for example, less than 100 angstroms, for example, 30 angstroms, 60 angstroms, or the like.

Figure 3C:
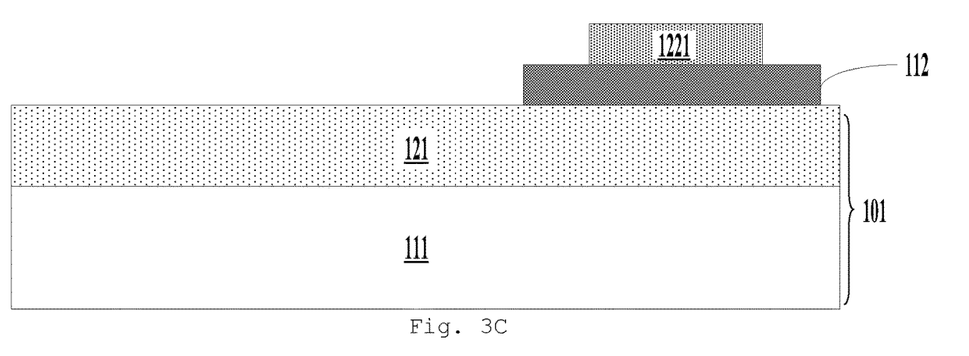

As shown in FIG. 3C, the first gate dielectric layer 1221 is formed on one side of the first active layer 112 away from the substrate 101.

For example, the first gate dielectric layer 1221 may be formed by an atomic layer deposition process at a temperature less than 450° C. The material of the first gate dielectric layer 1221 may comprise, for example, aluminum oxide or hafnium oxide. The thickness of the first gate dielectric layer 1221 may be, for example, less than 100 angstroms, for example, 30 angstroms, 50 angstroms, or the like.

Figure 3D:
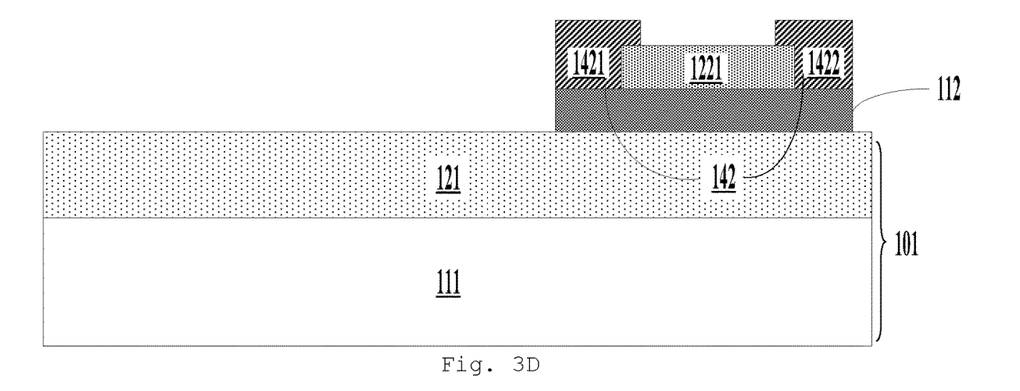

As shown in FIG. 3D, an ohmic contact layer 142 in contact with the first active layer 112 is formed. The ohmic contact layer 142 comprises a first portion 1421 and a second portion 1422 spaced apart from each other.

For example, the ohmic contact layer 142 may be formed by a magnetron sputtering process at a temperature less than 400° C. The material of the ohmic contact layer 142, for example, may comprise titanium. The thickness of the ohmic contact layer 142 may be, for example, less than 300 Angstroms, such as 100 Angstroms, 200 Angstroms, or the like.

In some embodiments, a first active material layer is formed on the substrate 101, and then a first gate dielectric material layer is formed on the first active material layer. After that, the first gate dielectric material layer is patterned to form a first gate dielectric layer 1221. Thereafter, an ohmic contact material layer is deposited and patterned to form an ohmic contact layer 142. After that, the first active material layer is patterned to form a first active layer 112.

It should be understood that, in some embodiments, the ohmic contact layer 142 may be not formed.

Figure 3E:
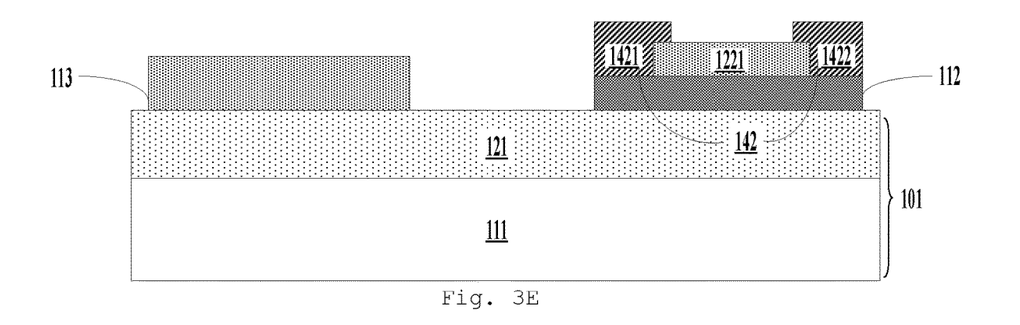

As shown in FIG. 3E, a second active layer 113 is formed on one side of the substrate 101.

For example, the second active layer 113 may be formed by a magnetron sputtering process at a temperature less than 400° C. The material of the second active layer 113 may comprise, for example, an oxide semiconductor. The thickness of the second active layer 113 may be, for example, 200 angstroms to 800 angstroms, such as 400 angstroms, 600 angstroms, or the like.

In some implementations, a second active material layer may be deposited on the structure shown in FIG. 3D, and then patterned to form a second active layer 113.

Figure 3F:
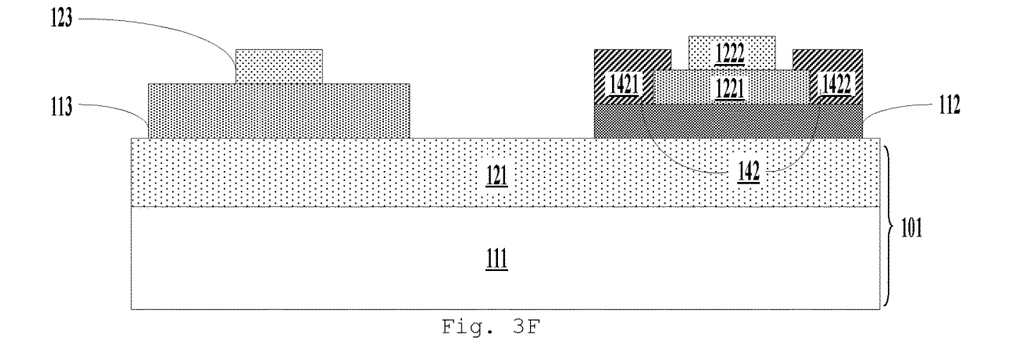

As shown in FIG. 3F, a third gate dielectric layer 1222 located on one side of the first active layer 112 away from the substrate 101 and a second gate dielectric layer 123 located on one side of the second active layer 113 away from the substrate 101 are formed by a first patterning process. Here, the material of the third gate dielectric layer 1222 is different from that of the first gate dielectric layer 1221. In some embodiments, the first gate dielectric layer 1221 is denser than the third gate dielectric layer 1222.

For example, the third gate dielectric layer 1222 and the second gate dielectric layer 123 may be formed by a chemical vapor deposition process at a temperature less than 400° C. The thickness of the third gate dielectric layer 1222 and the second gate dielectric layer 123 may be, for example, 1500 angstroms to 5000 angstroms, such as 2000 angstroms, 4000 angstroms, or the like. The material of the third gate dielectric layer 1222 and the second gate dielectric layer 123 may be, for example, an oxide of silicon.

In some implementations, an oxide of silicon material layer is deposited on the structure shown in FIG. 3E, and then patterned to form the third gate dielectric layer 1222 and the second gate dielectric layer 123.

In some embodiments, the orthographic projection of the first gate dielectric layer 1221 on the substrate 101 is a first projection, and the orthographic projection of the third gate dielectric layer 1222 on the substrate 101 is a second projection. Here, the first projection covers the second projection, and the area of the first projection is larger than that of the second projection. That is, the second projection is within the first projection.

Figure 3G:
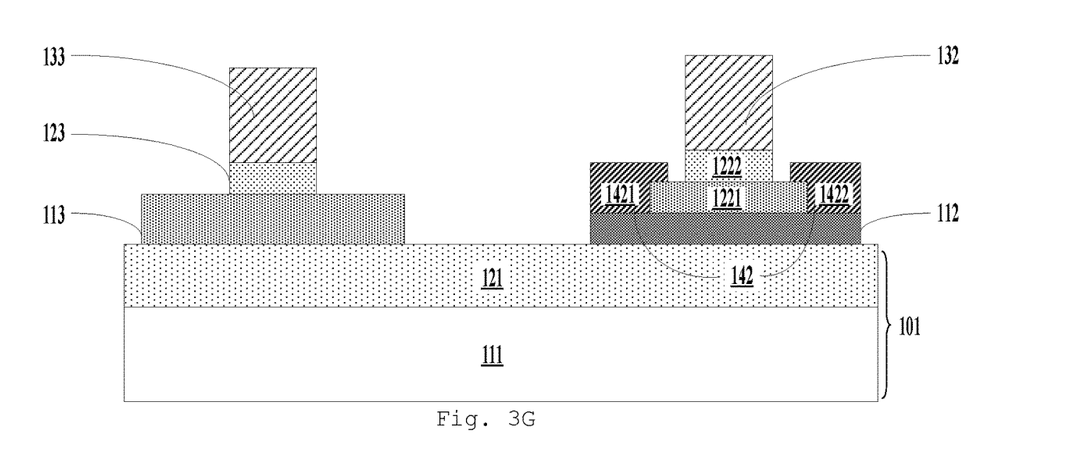

As shown in FIG. 3G, the first gate 132 located on one side of the first gate dielectric layer 1221 away from the first active layer 112 and the second gate 133 located on one side of the second gate dielectric layer 123 away from the second active layer 113 are formed by a second patterning process. It should be understood that, in the case where the third gate dielectric layer 1222 is formed, the first gate 132 is located on one side of the third gate dielectric layer 1222 away from the first gate dielectric layer 1221.

For example, the first gate 132 and the second gate 133 may be formed by a magnetron sputtering process at a temperature less than 400° C. The material of the first gate 132 and the second gate 133 may comprise, for example, one or more of the following metals: molybdenum, aluminum, and copper.

In some implementations, a gate material layer is deposited on the structure shown in FIG. 3F, and then patterned form the first gate 132 and the second gate 133.

Figure 3H:
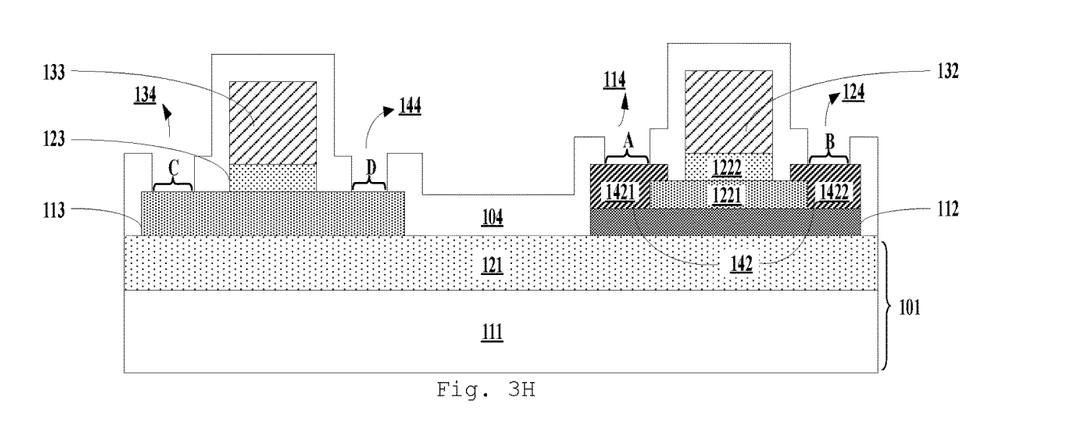

As shown in FIG. 3H, an interlayer dielectric layer 104 is formed. The interlayer dielectric layer 104 defines a first opening 114 that exposes the first area A of the first portion 1421, a second opening 124 that exposes the second area B of the second portion 1422, a third opening 134 that exposes the third area C of the second active layer 113, and a fourth opening 144 that exposes the fourth area D of the second active layer 113.

For example, the interlayer dielectric layer 104 may be formed by a chemical vapor deposition process at a temperature less than 400° C. The thickness of the interlayer dielectric layer 104 may be, for example, 3000 angstroms to 5000 angstroms, such as 4,000 angstroms. The material of the interlayer dielectric layer 104 may comprise, for example, a lamination comprising an oxide layer of silicon and a nitride layer of silicon.

In some implementations, an interlayer dielectric material layer may be deposited on the structure shown in FIG. 3G, and then patterned to form an interlayer dielectric layer 104 defining a first opening 114, a second opening 124, a third opening 134, and a fourth opening 144.

Figure 3I:
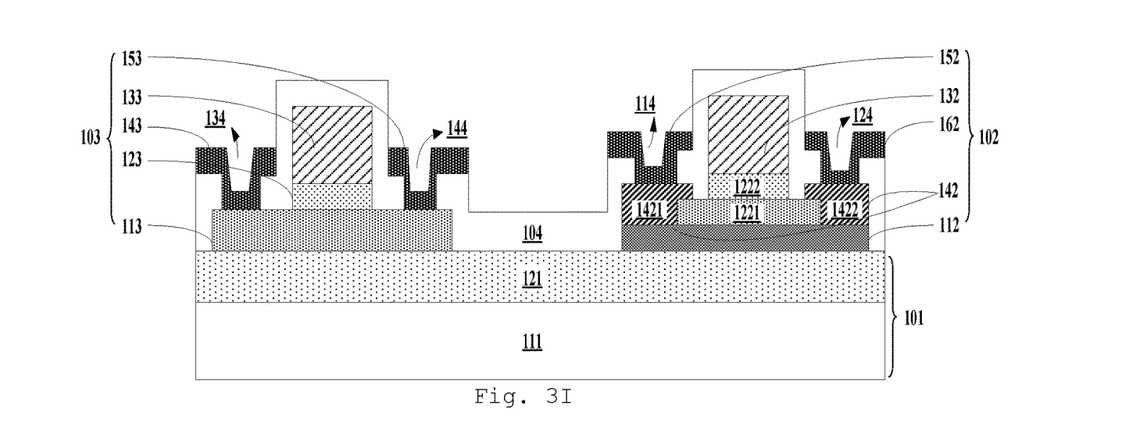

As shown in FIG. 3I, a first source 152 and a first drain 162 that are electrically connected to the first active layer 112, and a second source 143 and a second drain 153 that are electrically connected to the second active layer 113 are formed by a third patterning process. Here, the first source 152 is located in the first opening 114 and in contact with the first area A, the first drain 162 is located in the second opening 124 and in contact with the second area B, the second source 143 is located in the third opening 134 and in contact with the third area C, and the second drain 153 is located in the fourth opening 144 and in contact with the fourth area D.

For example, the first source 152, the first drain 162, the second source 143, and the second drain 153 may be formed by a magnetron sputtering process at a temperature less than 400° C. The material of the first source 152, the first drain 162, the second source 143, and the second drain 153 may comprise one or more of the following metals: molybdenum, aluminum, and copper.

In some implementations, an electrode material layer is deposited on the structure shown in FIG. 3H, and then patterned to form the first source 152, the first drain 162, the second source 143, and the second drain 153.

A planarization layer 105, an anode layer 106, and a pixel definition layer 107 may be further formed later to form the structure shown in FIG. 1. In addition, a support layer (not shown), such as a photoresist support layer (PS), may be formed on the pixel definition layer 107 to form a display backplane.

For example, the planarization layer 105, the anode layer 106, and the pixel definition layer 107 may be formed at a temperature less than 250° C. The material of the planarization layer 105 and the pixel definition layer 107 may comprise a resin material or the like. The material of the anode layer 106 may vary according to a light exiting direction. For example, the material of the anode layer 106 may comprise a metal capable of reflecting light or a metal capable of transmitting light. The thickness of the pixel definition layer 107 may be, for example, 1.5 µm to 3.5 µm, such as 2 µm.

The method for manufacturing the display backplane according to some embodiments of the present disclosure is introduced above. In the above method, the first active layer and the second active layer are located in a same layer, and one or more film layers of the first thin film transistor and the second thin film transistor may be formed by a same patterning process. On the one hand, the total number of the film layers in the display backplane is reduced, thereby lessening the adverse effects of excessive stress over the backplane and improving the yield of the display backplane. On the other hand, the process cost is also reduced.

In one or more embodiments, during the process of forming the backplane, the process temperature of a film layer formed later is lower than that of a film layer formed earlier to avoid adverse effects on the performance of the film layer formed earlier.

Figure 4:
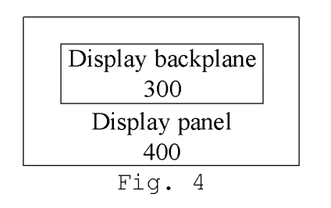
FIG. 4 is a schematic structural view showing a display panel according to an embodiment of the present disclosure.

FIG. 4 is a schematic structural view showing a display panel according to an embodiment of the present disclosure.

As shown in FIG. 4, the display panel 400 may comprise the display backplane 300 according to any one of the above embodiments.

Figure 5:
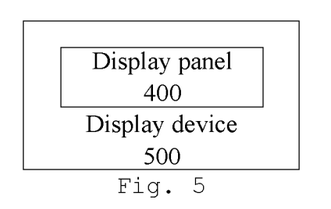
FIG. 5 is a schematic structural view showing a display device according to an embodiment of the present disclosure.

FIG. 5 is a schematic structural view showing a display device according to an embodiment of the present disclosure.

As shown in FIG. 5, the display device 500 may comprise the display panel 400 according to any one of the above embodiments. In some embodiments, the display device 500 may be, for example, any product or member having a display function, such as a mobile terminal, a television, a display, a notebook computer, a digital photo frame, a navigator, or electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display backplane, comprising:
a substrate;
a first thin film transistor located on one side of the substrate; and
a second thin film transistor located on the one side of the substrate, wherein:
the first thin film transistor comprises a first active layer and a first gate dielectric layer located on one side of the first active layer away from the substrate, and the second thin film transistor comprises a second active layer and a second gate dielectric layer located on one side of the second active layer away from the substrate, wherein:
the first active layer and the second active layer are located in a same layer, and a material of the first active layer is different from that of the second active layer,
the second gate dielectric layer is separated from the first gate dielectric layer and is not in contact with the first active layer, the first gate dielectric layer is not in contact with the second active layer, and
a thickness of the first active layer is 100 Angstroms smaller than that of the second active layer.

2. The display backplane according to claim 1, wherein the material of the first active layer comprises molybdenum disulfide or oxide semiconductor, and a material of the second active layer comprises oxide semiconductor.

3. The display backplane according to claim 1, wherein:
the first thin film transistor is a thin film transistor of a driving circuit or a switching transistor in a pixel; and
the second thin film transistor is a driving transistor configured to drive a light emitting device in the pixel to emit light.

4. The display backplane according to claim 1, wherein the first gate dielectric layer is denser than the second gate dielectric layer.

5. The display backplane according to claim 4, wherein the first thin film transistor further comprises:
   a third gate dielectric layer located on one side of the first gate dielectric layer away from the first active layer; and
   wherein a material of the third gate dielectric layer is the same as that of the second gate dielectric layer.

6. The display backplane according to claim 5, wherein an orthographic projection of the first gate dielectric layer on the substrate is a first projection, and the orthographic projection of the third gate dielectric layer on the substrate is a second projection, wherein the first projection covers the second projection, and an area of the first projection is greater than that of the second projection.

7. The display backplane according to claim 1, wherein the first thin film transistor further comprises an ohmic contact layer in contact with the first active layer, wherein the ohmic contact layer comprises a first portion and a second portion spaced apart from each other;
   the display backplane comprises an interlayer dielectric layer, wherein the interlayer dielectric layer defines a first opening exposing a first area of the first portion and a second opening exposing a second area of the second portion; and
   the first thin film transistor further comprises a first source located in the first opening and in contact with the first area, and a first drain located in the second opening and in contact with the second area.

8. The display backplane according to claim 7, wherein:
   the interlayer dielectric layer further defines a third opening exposing a third area of the second active layer and a fourth opening exposing a fourth area of the second active layer; and
   the second thin film transistor further comprises a second source located in the third opening and in contact with the third area, and a second drain located in the fourth opening and in contact with the fourth area; and
   wherein materials of the first source, the first drain, the second source, and the second drain are the same.

9. The display backplane according to claim 8, wherein:
   the first thin film transistor comprises a first gate located on one side of a first gate dielectric layer away from the first active layer; and
   the second thin film transistor comprises a second gate located on one side of a second gate dielectric layer away from the second active layer, wherein materials of the second gate and the first gate are the same.

10. A display panel, comprising: the display backplane according to claim 1.

11. A display device, comprising: the display panel according to claim 10.

12. The display panel according to claim 10, wherein the first gate dielectric layer is denser than the second gate dielectric layer.

13. The display panel according to claim 10, wherein the first thin film transistor further comprises:
   a third gate dielectric layer located on one side of the first gate dielectric layer away from the first active layer; and
   wherein a material of the third gate dielectric layer is the same as that of the second gate dielectric layer.

14. A method for manufacturing a display backplane, comprising:
   providing a substrate;
   forming, on one side of the substrate, a first thin film transistor and a second thin film transistor, wherein the first thin film transistor comprises a first active layer and a first gate dielectric layer located on one side of the first active layer away from the substrate, and the second thin film transistor comprises a second active layer and a second gate dielectric layer located on one side of the second active layer away from the substrate, wherein:
   the first active layer and the second active layer are located in a same layer,
   a material of the first active layer is different from that of the second active layer,
   the second gate dielectric layer is separated from the first gate dielectric layer and is not in contact with the first active layer, the first gate dielectric layer is not in contact with the second active layer, and
   a thickness of the first active layer is 100 Angstroms smaller than that of the second active layer.

15. The method according to claim 14, wherein the first gate dielectric layer is denser than the second gate dielectric layer.

16. The method according to claim 14, wherein forming, on the one side of the substrate, the first thin film transistor and the second thin film transistor comprises:
   forming the first active layer on the one side of the substrate;
   forming the first gate dielectric layer on the one side of the first active layer away from the substrate;
   forming the second active layer after forming the first gate dielectric layer; and
   forming a third gate dielectric layer on one side of the first gate dielectric layer away from the first active layer and the second gate dielectric layer by a first patterning process.

17. The method according to claim 14, wherein the material of the first active layer comprises molybdenum disulfide or oxide semiconductor, and a material of the second active layer comprises oxide semiconductor.

18. The method according to claim 14, wherein an orthographic projection of the first gate dielectric layer on the substrate is a first projection, and the orthographic projection of the third gate dielectric layer on the substrate is a second projection, wherein the first projection covers the second projection, and an area of the first projection is greater than that of the second projection.

19. The method according to claim 14, wherein forming, on the one side of the substrate, the first thin film transistor and the second thin film transistor further comprises:
   forming a first gate on one side of the first gate dielectric layer away from the first active layer and a second gate on one side of the second gate dielectric layer away from the second active layer by a second patterning process; and
   forming a first source and a first drain each electrically connected to the first active layer, and a second source and a second drain each electrically connected to the second active layer by a third patterning process.

20. The method according to claim 19, further comprising:
   forming, before forming the second active layer, an ohmic contact layer in contact with the first active layer, wherein the ohmic contact layer comprises a first portion and a second portion spaced apart from each other;
   forming, before the third patterning process, an interlayer dielectric layer, where the interlayer dielectric layer defines a first opening exposing a first area of the first portion, a second opening exposing a second area of the second portion, a third opening exposing a third area of the second active layer, and a fourth opening exposing a fourth area of the second active layer; and wherein the first source is located in the first opening and in contact with the first area, the first drain is located in the second opening and in contact with the second area, the second source is located in the third opening and in contact with the third area, and the second drain is located in the fourth opening and in contact with the fourth area.

\* \* \* \* \*

UNITED STATES PATENT AND TRADEMARK OFFICE
CERTIFICATE OF CORRECTION

PATENT NO. : 11,171,159 B2  
APPLICATION NO. : 16/630657  
DATED : November 9, 2021  
INVENTOR(S) : Niu et al.

Page 1 of 1

It is certified that error appears in the above-identified patent and that said Letters Patent is hereby corrected as shown below:

In the Claims

Column 13, Line 58, Claim 13, delete "laver" and insert -- layer --

Column 13, Line 58, Claim 13, delete "laver," and insert -- layer; --

Column 14, Line 4, Claim 14, delete "laver" and insert -- layer --

Column 14, Line 5, Claim 14, delete "laver" and insert -- layer --

Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*